United States Patent
Senbokuya et al.

(10) Patent No.: US 9,089,981 B2
(45) Date of Patent: Jul. 28, 2015

(54) SURFACE-COATED CUTTING TOOL

(75) Inventors: Kazuaki Senbokuya, Naka-gun (JP); Yusuke Tanaka, Tokyo (JP)

(73) Assignee: MITSUBISHI MATERIALS CORPORATION, Tokyo (JP)

(*) Notice: Subject to any disclaimer, the term of this patent is extended or adjusted under 35 U.S.C. 154(b) by 30 days.

(21) Appl. No.: 13/981,785

(22) PCT Filed: Jan. 27, 2012

(86) PCT No.: PCT/JP2012/051786
§ 371 (c)(1),
(2), (4) Date: Aug. 26, 2013

(87) PCT Pub. No.: WO2012/102374
PCT Pub. Date: Aug. 2, 2012

(65) Prior Publication Data
US 2014/0013914 A1    Jan. 16, 2014

(30) Foreign Application Priority Data
Jan. 27, 2011   (JP) ................. P2011-015348
Jan. 18, 2012   (JP) ................. P2012-007660

(51) Int. Cl.
*C23C 14/06* (2006.01)
*B26D 1/00* (2006.01)
(Continued)

(52) U.S. Cl.
CPC .......... *B26D 1/0006* (2013.01); *C23C 14/0641* (2013.01); *C23C 14/325* (2013.01); *C23C 14/505* (2013.01); *C23C 28/044* (2013.01); *C23C 28/048* (2013.01); *C23C 30/005* (2013.01)

(58) Field of Classification Search
USPC ............ 51/307, 309; 428/336, 697, 698, 699; 204/192.1
See application file for complete search history.

(56) References Cited

U.S. PATENT DOCUMENTS 7,226,670 B2 *   6/2007   Derflinger et al. ............ 428/699
7,498,089 B2 *   3/2009   Omori et al. .................... 51/307
(Continued)

FOREIGN PATENT DOCUMENTS

CN    1905974 A    1/2007
CN    101297061 A    10/2008
(Continued)

OTHER PUBLICATIONS

Uchida et al "Friction and wear properties of CrAlN and CrVN films depostied by cathodic arc ion plating method" Surface & Coatings Technology 177-178 (2004) p. 627-630.*
(Continued)

*Primary Examiner* — Archene Turner
(74) *Attorney, Agent, or Firm* — Leason Ellis LLP.

(57) ABSTRACT

A surface-coated cutting tool having excellent fracture resistance and wear resistance is provided. In the surface-coated cutting tool having at least a hard coating layer made of an (Al, Cr)N layer with a layer thickness of 0.5 μm to 10 μm formed to coat on the surface of a cutting tool body made of a WC cemented carbide, pores and droplets are dispersed and distributed in the (Al, Cr)N layer, the occupied area ratio of the pores and the occupied area ratio of the droplets in a cross-section of the (Al, Cr)N layer are 0.5 to 1 area % and 2 to 4 area % respectively, and, furthermore, out of the droplets, Al-rich droplets having a higher Al content ratio than the average Al content ratio of the (Al, Cr)N layer occupy 20 area % or more of the total droplet area.

7 Claims, 3 Drawing Sheets (51) Int. Cl.
  *C23C 28/04* (2006.01)
  *C23C 30/00* (2006.01)
  *C23C 14/32* (2006.01)
  *C23C 14/50* (2006.01)

(56) References Cited

U.S. PATENT DOCUMENTS

| 7,592,061 B1 * | 9/2009 | Yamamoto | 428/336 |
| 7,923,130 B2 * | 4/2011 | Shibata et al. | 428/697 |
| 2008/0233388 A1 | 9/2008 | Morita et al. | |
| 2011/0308941 A1 | 12/2011 | Krassnitzer et al. | |

FOREIGN PATENT DOCUMENTS

| DE | 10 2009 008 161 A | | 8/2010 |
| EP | 1 842 610 | * | 10/2007 |
| JP | 10-025566 | * | 1/1998 |
| JP | 2001-198709 | * | 7/2001 |
| JP | 2005-153072 A | | 6/2005 |
| JP | 2006-104512 A | | 4/2006 |
| JP | 2007-118139 A | | 5/2007 |
| JP | 2008-075178 A | | 4/2008 |
| JP | 2008-238336 A | | 10/2008 |
| JP | 2009-125832 A | | 6/2009 |
| JP | 2009-125834 A | | 6/2009 |
| JP | 2009-144236 A | | 7/2009 |
| WO | WO-2009/066772 A | | 5/2009 |

OTHER PUBLICATIONS

International Search Report mailed Mar. 6, 2012 for the corresponding PCT Application No. PCT/JP2012/051786.
Office Action mailed Nov. 28, 2014 for the corresponding Chinese Application No. 201280006447.9.
Shuangxi et al., "Development of metal bonded diamond abrasive tools", *Diamond & Abrasives Engineering*, Aug. 2006, pp. 71-75, Serial 154, No. 4.
Xing et al., "Preparation of Surface Gradient Composites and Their Application in Wear Resistance", *Foundry Technology*, Apr. 2006, pp. 408-411, vol. 27, No. 4.
European Search Report mailed Oct. 16, 2014 for the corresponding European Application No. 12739162.1.

* cited by examiner

SURFACE-COATED CUTTING TOOL

CROSS-REFERENCE TO RELATED PATENT APPLICATIONS

This application is a U.S. National Phase Application under 35 U.S.C. §371 of International Patent Application No. PCT/JP2012/051786, filed Jan. 27, 2012, and claims the benefit of Japanese Patent Applications No. 2011-015348, filed Jan. 27, 2011, and No. 2012-007660, filed Jan. 18, 2012, all of which are incorporated by reference in their entities herein. The International Application was published in Japanese on Aug. 2, 2012 as International Publication No. WO/2012/102374 under PCT Article 21(2).

FIELD OF THE INVENTION

The present invention relates to a surface-coated cutting tool (hereinafter referred to as coated cutting tool) exhibiting excellent wear resistance over long-term use in, for example, high-speed cutting of a work, such as carbon steel, alloy steel, or the like, by having excellent fracture resistance in a hard coating layer.

BACKGROUND OF THE INVENTION

As described in PTL 1, for example, a coated cutting tool is known. In this cutting tool, (a) a composite nitride layer of Al and Ti having an average layer thickness of 0.5 µm to 5 µm as a lower layer, (b) a composite nitride layer of Al and Cr having an average layer thickness of 0.5 µm to 5 µm as an intermediate layer, and (c) a composite nitride layer of Al and Ti having an average layer thickness of 0.2 µm to 0.6 µm as an upper layer are formed to coat on a surface of a cutting tool body made of a tungsten carbide-based cemented carbide. This coated cutting tool is known to exhibit excellent fracture resistance and wear resistance in, for example, the high-speed heavy cutting of mild steel, stainless steel, or the like.

In addition, a coated rotating tool described in PTL 2 is proposed. PTL 2 discloses a coated rotating tool, such as a coated end mill, in which an end cutting edge is provided on a tool front end face, a peripheral cutting edge is provided on a tool peripheral face, and a hard coating layer is formed on the surface of the cutting tool body. In this coated rotating tool, a plurality of microparticles projects on the surface of the coating layer, the area ratio of microparticles projecting on a rake face is 2 area % to 10 area %, and the area ratio of microparticles projecting on a flank face is 10 area % to 30 area %. Furthermore, the average projection angle of the microparticles projecting on the rake face to the direction perpendicular to an interface between the cutting tool body and the coating layer is 5° to 20° (in a direction away from a cutting edge). It is known that this coated rotating tool improves the fracture resistance and wear resistance of the coated cutting tool.

In addition, a surface-coated cutting tool described in PTL 3 is proposed. In this coated cutting tool, a honed face is formed at an intersecting ridge portion between a rake face and a flank face on a surface of the cutting tool body. This surface of the cutting tool body is coated with a hard coating layer formed using a CVD method. In the surface-coated cutting tool, the rake face and the surface of the hard coating layer of the honed face are ground, and finely hollowed portions are present on the rake face than on the honed face. It is known that this coated cutting tool enhances the lubricity of the cutting tool to a work, and improves the fracture resistance and wear resistance of the cutting tool.

In addition, a coated cutting tool described in PTL 4 is proposed. In the coated cutting tool of PTL 4, a hard coating layer is formed using a PVD method. The layer thickness of an uppermost layer of the hard coating layer is 0.1 µm to 1.5 µm, and approximately 0.1 µm to 10.0 µm-wide pores are formed on the surface of the uppermost layer. It is known that, according to the coated cutting tool, the wettability of the surface of the hard coating layer is improved, and the frictional resistance is reduced.

RELATED ART DOCUMENT

Patent Literature

PTL 1: Japanese Unexamined Patent Application, First Publication No. 2009-125832
PTL 2: Japanese Unexamined Patent Application, First Publication No. 2008-238336
PTL 3: Japanese Unexamined Patent Application, First Publication No. 2007-118139
PTL 4: Japanese Unexamined Patent Application, First Publication No. 2005-153072

Problems to be Solved by the Present Invention

In recent years, there has been a strong demand for power-saving and energy-saving in cutting work, and, accordingly, coated cutting tools have been used under severer conditions. For example, in a case in which a work, such as carbon steel, alloy steel or the like, is worked under a high-speed cutting condition accompanied by the generation of high-temperature heat using the coated cutting tool described in PTL 1, fracturing becomes likely to occur in the hard coating layer. As a result, the service life of the coated cutting tool ends in a relatively short period of time.

Attempts have been also made to form droplets (microparticles) or pores (fine hollow portions) on the surface of the hard coating layer in order to enhance the fracture resistance of the coated cutting tool as described in PTLs 2 to 4. However, the fracture resistance cannot be yet said to be sufficiently improved.

SUMMARY OF THE INVENTION

Means for Solving the Problems

Therefore, based on the above-described viewpoint, the present inventors carried out thorough studies regarding a coated cutting tool that has excellent fracture resistance in a hard coating layer and exhibits excellent wear resistance over long-term use even in a case in which the coated cutting tool is used in high-speed cutting which is accompanied by the generation of high-temperature heat. As a result, the following finding was obtained.

In a coated cutting tool in which at least an Al and Cr composite nitride (hereinafter indicated by (Al, Cr)N) layer is formed to coat the cutting tool body as a hard coating layer, an occupied area ratio P (density) of pores formed in the (Al, Cr)N layer is maintained in a predetermined numeric range (P=0.5 area % to 1 area %). In addition, a relationship between an occupied area ratio D of all droplets contained in the (Al, Cr)N layer (D=2 area % to 4 area %) and an occupied area ratio Dal of, out of the droplets, Al-rich droplets having a higher Al content ratio (atomic %) than an average Al content ratio to a total amount of Al and Cr in the (Al, Cr)N layer (here, Dal/D≥0.2) is maintained in a predetermined numeric range (Dal=0.4 area % to 4 area %). When the above conditions are satisfied, the (Al, Cr)N layer exhibits excellent fracture resistance. As a result, a coated cutting tool exhibiting excellent wear resistance over long-term use can be obtained.

The occupied area ratio P of the pores, the occupied area ratio D of the droplets and the occupied area ratio Dal of the Al-rich droplets in the (Al, Cr)N layer can be obtained by, for example, controlling the magnetic field of an electromagnetic coil placed on a rear surface of a target so that an intensity of the magnetic flux density at a center of the surface of the Al—Cr alloy target becomes 55 G to 100 G when forming a film using an arc ion plating method.

The present invention has been made based on the above finding, and has the following aspects.

(1) A surface-coated cutting tool including: a cutting tool body made of tungsten carbide-based cemented carbide; and a hard coating layer including an Al and Cr composite nitride layer, which is formed on the cutting tool body to coat the cutting tool body and has a layer thickness of 0.5 µm to 10 µm, wherein pores and droplets are dispersed and distributed in the Al and Cr composite nitride layer, an occupied area ratio of the pores and an occupied area ratio of the droplets in a cross-section of the Al and Cr composite nitride layer are 0.5 to 1 area % and 2 to 4 area % respectively, and, out of the droplets, Al-rich droplets having a higher Al content ratio than an average Al content ratio of the Al and Cr composite nitride layer occupy 20 area % or more of a total droplet area in the cross-section of the Al and Cr composite nitride layer.

(2) The surface-coated cutting tool according to (1) mentioned above, wherein the hard coating layer includes a first layer made of an Al and Ti composite nitride layer formed to coat the cutting tool body, a second layer made of an Al and Cr composite nitride layer formed to coat on the first layer, and a third layer made of an Al and Ti composite nitride layer formed to coat on the second layer, and a content ratio of Ti to a total amount of Ti and Al in the first layer and the third layer made of the Al and Ti composite nitride layer is 20 atomic % to 60 atomic %.

(3) The surface-coated cutting tool according to (2) mentioned above, wherein layer thicknesses of the first layer and the third layer made of the Al and Ti composite nitride layer are 0.5 µm to 5 µm and 0.2 µm to 1 µm respectively.

(4) The surface-coated cutting tool according to any one of (1) to (3) mentioned above, wherein a content ratio of Cr to a total amount of Cr and Al in the Al and Cr composite nitride layer is 20 atomic % to 50 atomic %.

(5) A method for manufacturing a surface-coated cutting tool in which a hard coating layer including a composite nitride layer is formed on a cutting tool body using an arc ion plating method, including: a hard coating layer-forming step of forming a hard coating layer through deposition on the cutting tool body using an arc ion plating apparatus, wherein the hard coating layer-forming step includes: a cutting tool body inserting step in which the cutting tool body is placed on a rotatable rotary table provided in the arc ion plating apparatus; a rotating step in which the rotary table having the cutting tool body placed thereon is rotated; a target-evaporating step in which a target made of an Al—Cr alloy placed on one side of both sides of the rotary table is evaporated by arc discharge; and a magnetic field generation step in which the magnetic flux density of 55 G to 100 G is generated at a center of a surface of the target made of the Al—Cr alloy, and the composite nitride layer is an Al and Cr composite nitride layer. Pores and droplets are dispersed and distributed in the Al and Cr composite nitride layer so that an occupied area ratio of the pores and an occupied area ratio of the droplets in a cross-section of the Al and Cr composite nitride layer are 0.5 to 1% of the area and 2 to 4% of the area, respectively, and, out of the droplets, Al-rich droplets having a higher Al content ratio than an average Al content ratio of the Al and Cr composite nitride layer occupy 20% or more of a total droplet area in the cross-section of the Al and. Cr composite nitride layer.

Advantageous Effects of Invention

The coated cutting tool, which is an aspect of the present invention, has a hard coating layer including an Al and Cr composite nitride layer (hereinafter sometimes referred to as "(Al, Cr)N layer") formed to coat the cutting tool body. The occupied area ratio P of pores and the occupied area ratio D of droplets in the (Al, Cr)N layer are specified as 0.5 area % to 1 area % and 2 area % to 4 area % respectively. In addition, the occupied area ratio Dal of Al-rich droplets is set to 0.4 area % to 4 area %. In addition, Dal/D is set to 0.2 or more. With the above described configurations, the coated cutting tool, which is an aspect of the present invention, has excellent fracture resistance in the hard coating layer in high-speed cutting of a work, such as carbon steel, alloy steel, or the like. As a result, the coated cutting tool exhibits excellent wear resistance over long-term use.

In the method for manufacturing a coated cutting tool, which is another aspect of the present invention, the magnetic flux density of 55 G to 100 G, which is used in forming a film, is generated at the center of the surface of a target evaporated using arc discharge. Thereby, the coated cutting tool, which is an aspect of the present invention, can be manufactured.

DETAILED DESCRIPTION OF THE INVENTION
BEST MODE FOR CARRYING OUT THE PRESENT INVENTION

Next, embodiments of the present invention will be described in detail below.

An (Al, Cr)N Layer Included in a Hard Coating Layer:

In a hard coating layer including an (Al, Cr)N layer (Al and Cr composite nitride layer), an Al component, which is a constituent component of the layer, improves high-temperature hardness and thermal resistance, and a Cr component improves high-temperature strength. Furthermore, the coexistence of Al and Cr provides an action of improving high-temperature oxidation resistance.

In the (Al, Cr)N layer, when the content ratio of Cr to the total amount of Cr and Al is less than 20 atomic %, it is not possible to ensure building-up resistance to a work, and the (Al, Cr)N layer chips in the high-speed cutting of the work that is highly prone to be built-up, and the high-temperature strength also decreases. Therefore, a coated cutting tool becomes likely to be built-up to the work and fractured.

On the other hand, when the content ratio of Cr to the total amount of Cr and Al exceeds 50 atomic %, the relative reduction of the content ratio of Al causes the degradation of the high-temperature hardness of the coated cutting tool and the degradation of the thermal resistance, and the occurrence of uneven wear, thermal plastic deformation and the like, which is caused by the above-mentioned degradation, degrades the wear resistance.

For the above reasons, in the (Al, Cr)N layer included in the hard coating layer, the content ratio of Cr to the total amount of Cr and Al is desirably set to 20 atomic % to 50 atomic %.

In addition, when the average layer thickness of the (Al, Cr)N layer is less than 0.5 μm, it is not possible to exhibit excellent wear resistance over long-term use. On the other hand, when the average layer thickness exceeds 10 μm, fracturing becomes likely to occur in a cutting edge portion during high-speed cutting. For the above reasons, the average layer thickness of the (Al, Cr)N layer is specified as 0.5 μm to 10 μm.

Figure 1A:
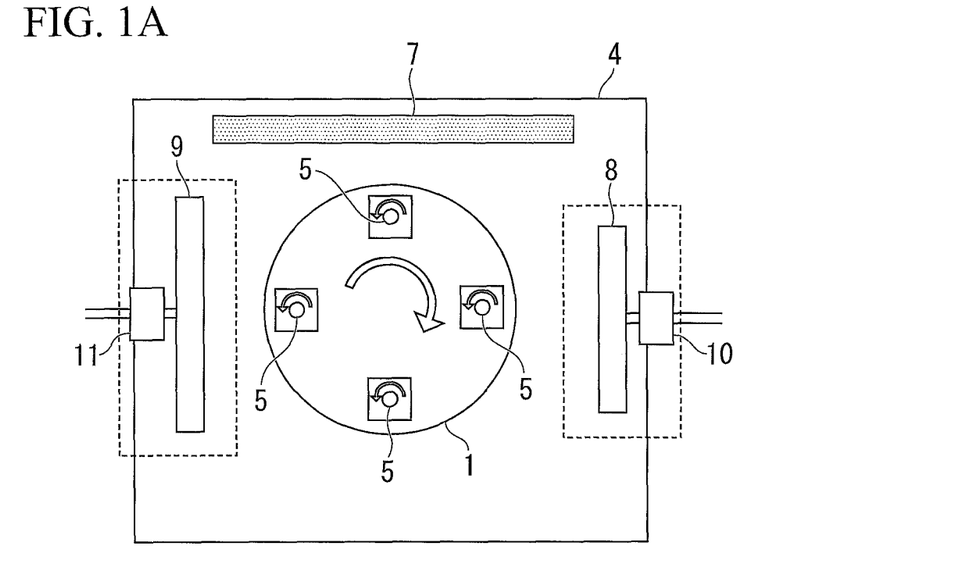
FIG. 1A is a schematic plane view of an arc ion plating apparatus which forms a hard coating layer of a coated cutting tool of the present invention.
Figure 1B:
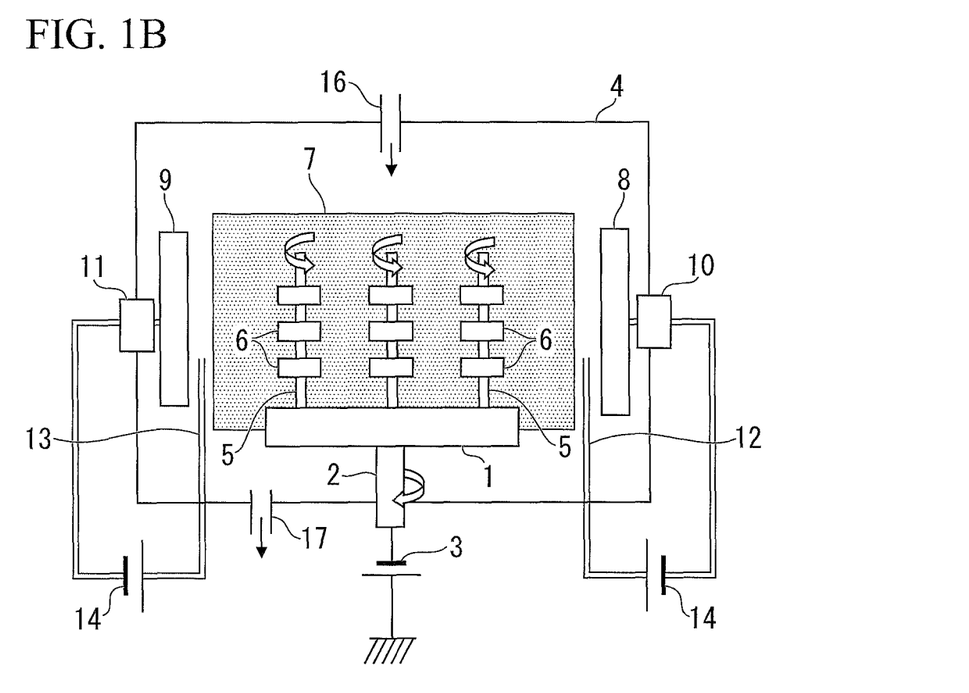
FIG. 1B is a schematic side view of the arc ion plating apparatus which forms the hard coating layer of the coated cutting tool of the present invention.

The Occupied Area Ratio P of Pores in the (Al, Cr)N Layer:

In the present invention, for example, in forming a film using an arc ion plating apparatus schematically illustrated in FIGS. 1A and 1B, when a film is formed by controlling the magnetic field of an electromagnetic coil placed on a rear surface of a target so that the intensity of the magnetic flux density at the center of the surface of an Al—Cr alloy target becomes 55 G to 100 G, it is possible to obtain a predetermined occupied area ratio P of pores to the area of the (Al, Cr)N layer.

That is, when the (Al, Cr)N layer is formed using the arc ion plating method by controlling the magnetic field so that the intensity of the magnetic flux density at the center of the surface of the Al—Cr alloy target becomes 55 G to 100 G, pores are formed in the (Al, Cr)N layer at an "occupied area ratio P of pores" (i.e., the ratio of the area of pores to the measured area measured using TEM-EDS in a cross-section of the (Al, Cr)N layer) in a range of 0.5% to 1%.

The occupied area ratio of pores is particularly influenced by the intensity of the magnetic field at the center of the surface of the target. As the intensity of the magnetic flux density increases, the occupied area ratio of pores decreases. However, when the intensity of the magnetic flux density becomes higher than 100 G, the occupied area ratio of pores becomes less than 0.5%. As a result, compressive residual stress is accumulated in the (Al, Cr)N layer, the strength tends to decrease due to the embrittlement of a film, and the coated cutting tool becomes incapable of enduring cutting for a long period of time.

On the other hand, when the intensity of the magnetic flux density at the center of the surface of the target becomes lower than 55 G, the occupied area ratio P of pores exceeds 1%, and pores are likely to act as starting points of cracking and, consequently, the strength of the film decreases.

Therefore, the occupied area ratio P of pores in the (Al, Cr)N layer is specified as 0.5 area % to 1 area %.

The Occupied Area Ratio D of Droplets in the (Al, Cr)N Layer:

The occupied area ratio D of droplets in the (Al, Cr)N layer has a correlation with the occupied area ratio P of pores formed using the arc ion plating method. In a case in which the occupied area ratio D of droplets is less than 2 area % or exceeds 4 area %, the occupied area ratio P of pores becomes less than 0.5 area % or exceeds 1 area %. For the above reason, the occupied area ratio D of droplets is specified as 2 area % to 4 area %.

The Occupied Area Ratio Dal of Al-rich Droplets in the (Al, Cr)N Layer:

In this specification, droplets containing a higher content ratio of Al than the average content ratio of Al to the total amount of Al and Cr in the (Al, Cr)N layer are called Al-rich droplets.

In a case in which the occupied area ratio Dal of the Al-rich droplets out of the total droplets is less than 20 area % (Dal/D<0.2), the thermal resistance and oxidation resistance of the (Al, Cr)N layer become insufficient. Therefore, the occupied area ratio Dal of the Al-rich droplets to the total droplets is specified as 20 area % or more (Dal/D≥0.2).

In addition, in a method for calculating the average Al content to the total amount of Al and Cr in the (Al, Cr)N layer, compositions are measured at least at three locations other than droplet portions in the film, and an average value of the Al values of the respective measured values to the total amount of Al and Cr is measured.

Specifically, a droplet having a content ratio higher than the average content ratio of Al to the total amount of Al and Cr in an extent of 2 atomic % or more, is considered as an Al-rich droplet.

In order to set the occupied area ratio Dal of the Al-rich droplets to the total droplets to 20 area % or more (Dal/D≥0.2), it is necessary to set, for example, the nitrogen pressure during the formation of a film to 0.5 Pa or higher. Then, Dal can be set 0.4 to 4 area % consequently by further setting the magnetic flux density at the center of the surface of the target to 55 G to 100 G.

In the present invention, the occupied area ratio Dal of the Al-rich droplets is desirably an occupied area fraction satisfying the following formula (1).

$$\text{The occupied area ratio Dal of the Al-rich droplets (area \%)} = 0.4 \text{ to } 4 \text{ (area \%)} \quad (1)$$

This is because, when Dal is less than 0.4 area %, for example, in a case in which carbon steel is cut, the carbon steel becomes easily built-up to the cutting tool, and the wear resistance deteriorates. In addition, in a case in which Dal exceeds 4 area %, the film hardness in the (Al, Cr)N layer degrades, wearing proceeds faster, and the wear resistance deteriorates.

Layer Thickness:

When the layer thickness is less than 0.5 μm, the (Al, Cr)N layer cannot exhibit excellent wear resistance over long-term use, and, on the other hand, when the layer thickness exceeds 10 μm, a tendency of the fracture resistance degrading appears. For the above-described reasons, the layer thickness of the (Al, Cr)N layer is specified as 0.5 μm to 10 μm.

The (Al, Ti)N Layer as the Hard Coating Layer:

In the surface-coated cutting tool, which is an embodiment of the present invention, the hard coating layer may also include a composite nitride layer other than the (Al, Cr)N layer. For example, it is possible to form an Al and Ti composite nitride (hereinafter indicated by (Al, Ti)N) layer having a predetermined layer thickness through coating on the surface of a cutting tool body as a first layer, form the (Al, Cr)N layer through coating on the first layer as a second layer, and, furthermore, form an (Al, Cr)N layer having a predetermined layer thickness through coating on the second layer as a third layer.

When the first layer and the third layer are formed, it is possible to further improve the thermal resistance and the wear resistance. In order to form the first layer and the third layer, the content ratio of Ti to the total amount of Ti and Al needs to be 20 atomic % to 60 atomic %, in addition, the layer thickness of the first layer is desirably 0.5 µm to 5 µm, and the layer thickness of the third layer is desirably 0.2 µm to 1 µm.

In addition, when the (Al, Ti)N layers are formed f as the first layer and the third layer, particularly, it is possible to reduce the affinity to and reactivity with an Fe component in a work, and building-up resistance can be improved.

In a case in which the composite nitride layer included in the hard coating layer of the coated cutting tool of the embodiment of the present invention is analyzed, the cross-section of the composite nitride layer is prepared through the cutting, grinding or the like of the coated cutting tool. This cross-section is analyzed using a TEM-EDS mapping method. In this analysis, the above cross-section is scanned using an electron beam, and the physical properties of an area, which is an analysis target, are determined. Thereby, the occupied area ratio of pores or droplets included in the target area or the content ratios of elements in the droplets is determined. The measurement conditions are an acceleration voltage of 200 kV, a TEM spot size of 1 nm, an observation magnification of 30,000 times, a unit measurement time of 1 hour, and a unit observation area of 12 µm².

The method for manufacturing a coated cutting tool, which is the other embodiment of the present invention, can be carried out using the arc ion plating apparatus illustrated in, for example, FIGS. 1A and 1B. This method for manufacturing a coated cutting tool enables the manufacturing of the coated cutting tool, which is the embodiment of the present invention.

The arc ion plating apparatus includes an air-tight chamber 4 and a rotary table 1 in the chamber. A plurality of cutting tool bodies 6 is held on the top surface of the rotary table 1. A driving shaft 2 driven using a bias power supply 3 is connected to the bottom surface of the rotary table 1. The rotary table 1 also rotates around the shaft direction of the driving shaft 2 by the rotary motion of the driving shaft 2 around the shaft direction.

A plurality of rotary shafts 5 extending toward the opposite side of the driving shaft 2 is placed on the rotary table 1. A plurality of the cutting tool bodies 6 is held on the rotary table 1 in a state of being penetrated by the rotary shafts 5. The rotary shaft 5 rotates around the shaft independently from the rotary table 1. The cutting tool bodies 6 held by the rotary shafts 5 are also rotated by the rotation of the rotary shafts 5. In the embodiment illustrated in FIGS. 1A and 1B, the rotary shafts 5 rotate in the opposite direction to that of the rotary table 1.

A heater 7 is placed on the back surface of the rotary table 1. The atmosphere temperature in the chamber 4 is adjusted by controlling the output of the heater 7.

A cathode electrode 8 and a cathode electrode 9 are placed on the side surfaces of the rotary table 1 in a form of sandwiching the rotary table 1 from both sides. The cathode electrode 8 is made of a Ti—Al alloy. The cathode electrode 9 is made of an Al—Cr alloy. Electromagnetic coils 10 and 11 are placed on the back surfaces of the cathode electrodes 8 and 9. When an arc power supply current is applied from an arc power supply 14, arc discharge is caused between an anode electrode 12 and the cathode electrode 8, and some of the cathode electrode 8 is evaporated. Similarly, when an arc power supply current is applied from an arc power supply 15, arc discharge is caused between an anode electrode 13 and the cathode electrode 9, and some of the cathode electrode 9 is evaporated. When a current is made to flow through the electromagnetic coils 10 and 11, the magnetic field is generated at the center of the surface of the cathode electrode 8 and the cathode electrode 9 respectively.

A reaction gas having a predetermined composition is introduced into the chamber 4 at a predetermined flow rate from a reaction gas inflow path 16. A predetermined composition of gas, corresponding to the inflow composition of the reaction gas, is exhausted from the chamber 4 through an exhaust gas outflow path 17.

The method for manufacturing a coated cutting tool, which is the other embodiment of the present invention, includes the following steps.

Hard Coating Layer-forming Step:

In a hard coating layer-forming step, a hard coating layer is formed through deposition on a cutting tool body using the arc ion plating apparatus illustrated in FIGS. 1A and 1B. The cutting tool body 6 is obtained by sintering green compact, and is made of tungsten carbide-based cemented carbide. The hard coating layer includes an Al and Cr composite nitride layer having a layer thickness of 0.5 µm to 10 µm. Pores and droplets are dispersed and distributed in the Al and Cr composite nitride layer. The occupied area ratio of the pores and the occupied area ratio of the droplets in a cross-section of the Al and Cr composite nitride layer are 0.5 area % to 1 area % and 2 area % to 4 area % respectively. Out of the droplets, the Al-rich droplets having a higher Al content ratio than the average Al content ratio of the Al and Cr composite nitride layer occupy 20 area % or more of the total droplet area in the cross-section of the Al and Cr composite nitride layer.

The hard coating layer-forming step includes a cutting tool body inserting step, a rotating step, a target-evaporating step and a magnetic field generation step, which will be described below.

Cutting Tool Body Inserting Step:

A plurality of the cutting tool bodies 6 made of tungsten carbide-based cemented carbide is charged into the chamber 4 of the arc ion plating apparatus. The cutting tool bodies 6 are held on the top surface of the rotary table 1 placed in the chamber 4 of the arc ion plating apparatus. The cutting tool bodies 6 are held by the rotary shafts 5 in a form of being penetrated by the rotary shafts 5 provided on the top surface of the rotary table 1. A plurality of the rotary shafts 5 is provided on the rotary table 1, and a plurality of the cutting tool bodies 6 is held by one rotary shaft 5 in a vertically stacked form.

Rotating Step:

The rotary table 1 is rotated by driving the rotary table-driving shaft 2 connected to the bottom surface of the rotary table. The shaft direction of the rotary table-driving shaft 2 is the same as the direction of gravity. Therefore, the rotary table 1 makes a rotary motion in a plane perpendicular to the direction of gravity.

Target-Evaporating Step:

Arc discharge is generated between the cathode electrode 8 and the anode electrode 12 by supplying power from the arc power supply 14 placed between the cathode electrode 8 and the anode electrode 12. Alternatively, arc discharge is generated between the cathode electrode 9 and the anode electrode 13 by supplying power from the arc power supply 15 placed between the cathode electrode 9 and the anode electrode 13. The arc discharge evaporates some of the cathode electrodes 8 and 9. A part of the evaporated cathode electrode component becomes composite nitrides or droplets, and the nitrides and droplets are deposited on the cutting tool bodies 6.

A Magnetic Field Generation Step:

A current is made to flow through the electromagnetic coils 10 and 11 respectively placed on the back surfaces of the cathode electrodes 8 and 9. Thereby, the magnetic flux density of 55 G to 100 G are generated at the center of the surface of the cathode electrode 8 and the cathode electrode 9, that is, the Ti—Al alloy target or the Al—Cr alloy target.

The coating conditions of the nitride layer in the method for manufacturing a coated cutting tool, which is the other embodiment of the present invention, are, for example, as follows.

coating temperature: 300° C. to 500° C.,
coating pressure: 0.5 Pa to 10 Pa,
coating time: 0.15 hours to 8 hours,
Dimensions of the target: diameter 100 mm×thickness 12 mm,
Reaction gas composition: pure nitrogen,
Dimensions of the rotary table: diameter 600 mm,
Rotating speed of the rotary table: 1 rpm to 4 rpm,
Distance from the target to the center of the rotary table: 450 mm,
Arc power supply current: 100 A to 200 A,
The Magnetic flux density at the center of the target: 55 G to 100 G.

Next, the coated cutting tool, which is the embodiment of the present invention, will be described more specifically using examples.

EXAMPLES

WC powder, TiC powder, ZrC powder, VC powder, TaC powder, NbC powder, $Cr_3C_2$ powder, TiN powder, TaN powder and Co powder, all of which had an average particle diameter of 1 μm to 3 μm, were prepared as raw material powders. These raw material powders were blended into the blend compositions described in Table 1, furthermore, a wax was added, and the mixture was mixed in acetone for 24 hours using a ball mill. After this mixture was dried at reduced pressure, the mixture was press-molded at a pressure of 98 MPa, and powder compacts having predetermined shapes of ISO-SEEN1203AFTN1 (carbide bodies A to E) were obtained. These powder compacts were sintered in a vacuum under conditions in which the compacts were held in a vacuum of 5 Pa at the temperature in a range of 1370° C. to 1470° C. for 1 hour, thereby obtaining sintered compacts. After sintering, the cutting edge portions of the sintered compacts were chamfered and honed to a width of 0.15 mm at an angle of 20 degrees. WC-based cemented carbide cutting tool bodies A to E were manufactured respectively using the above-described series of steps.

Next, these cutting tool bodies A to E were charged into the arc ion plating apparatus illustrated in FIGS. 1A and 1B, and Al—Ti bombardment or Ti bombardment was carried out under the conditions described in Table 2. Next, (Al, Cr)N layers and (Al, Ti)N layers, which had a predetermined layer thickness, were similarly formed through deposition under the conditions described in Table 2. Coated cutting tools of the present invention 1 to 24 described in Table 3 were manufactured using the above steps.

The cross-sections of the (Al, Cr)N layers of the coated cutting tools of the present invention 1 to 24 were observed using TEM-EDS, and the occupied area ratios P of pores to the measured areas, the occupied area ratios D of droplets, and the occupied area ratios Dal of Al-rich droplets were measured. In addition, the values of Dal/D were computed based on the above-mentioned measured values. The specific TEM-EDS measurement method will be described below: measurement method: TEM-EDS mapping, acceleration voltage: 200 kV, TEM spot size: 1 nm, observation magnification: 30000 times, and unit measurement time: 1 hour. The unit observation area was 4 μm×3 μm, and three areas were measured. Furthermore, using a TEM image and an EDS mapping image of the same observation area, pore portions and droplet portions were mapped using the approximate outlines of the shapes of the respective portions: square forms and rectangular forms for the pore portions and circular forms and oval forms for the droplet portions. Based on the total cross-sectional area of the (Al, Cr)N layers and the markings in three observation areas, the total cross-sectional area of the pore portions and the droplet portions in the three observation areas were calculated. The total cross-sectional area of the pore portions to the total cross-sectional area of the (Al, Cr)N layers was considered as the occupied area ratio P of pores, and the total cross-sectional area of the droplet portions to the total cross-sectional area of the (Al, Cr)N layers was considered as the occupied area ratio D of droplets.

Furthermore, the average Al content ratio to the total amount of Al and Cr was calculated from content ratios at three locations other than the droplet portion in the (Al, Cr)N layer. Then, the value was regarded as the average Al content in the (Al, Cr)N layer. In addition, the Al content ratio to the total amount of Al and Cr were calculated in the respective droplets from composition of the respective droplets. Then, a droplet was considered as an Al-rich droplet, when the droplet had an Al content ratio higher than the average Al content in the (Al, Cr)N layer in an extent of 2 atomic % or more. The total cross-sectional area of the Al-rich droplet portions in three observation areas was computed based on the mapping. The total cross-sectional area of the Al-rich droplet portions to the total cross-sectional area of the (Al, Cr)N layer was considered as the occupied area ratio Dal of the Al-rich droplets.

Table 4 describes these values respectively.

Figure 2:
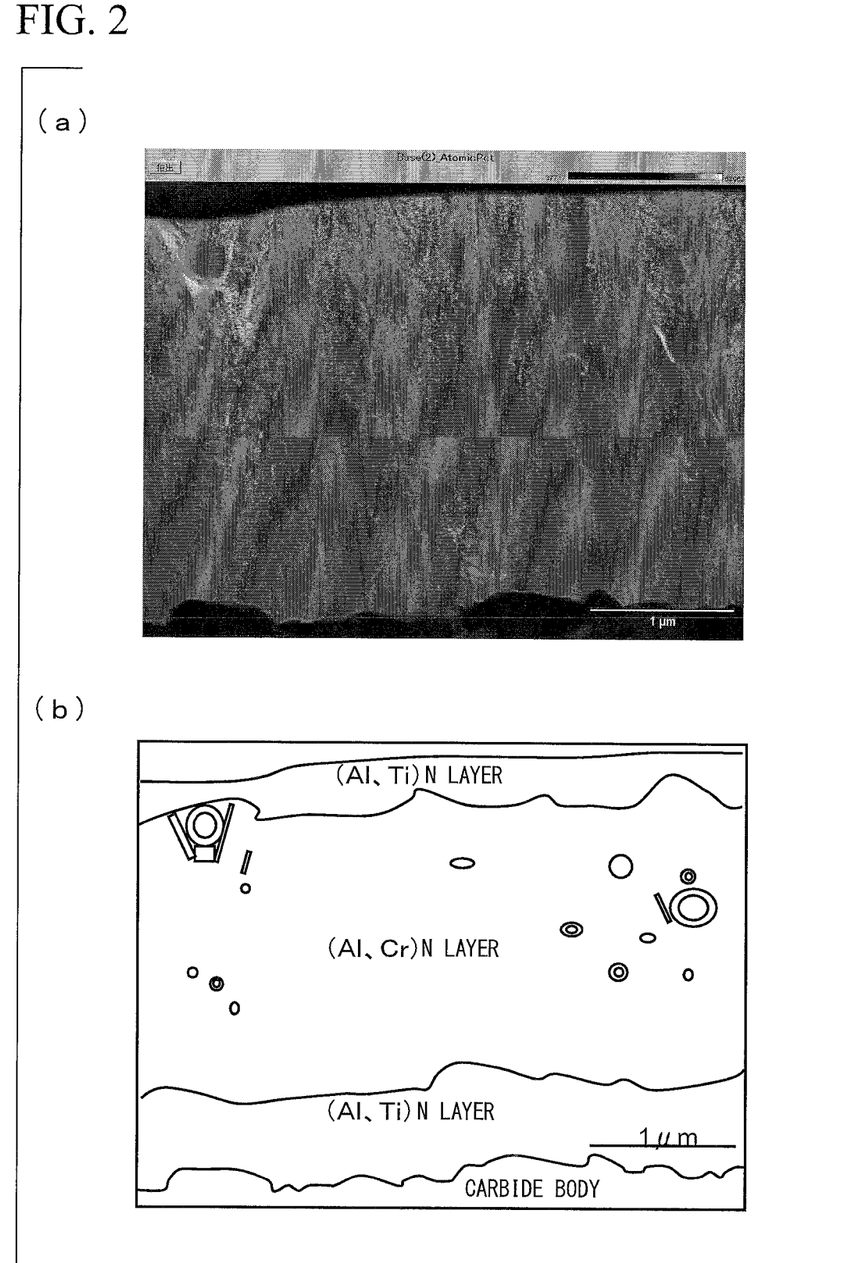
FIG. 2 illustrates the cross-sections of an (Al, Cr)N layer of the coated cutting tool of the present invention, in which FIG. 2 (*a*) is a TEM photograph of a cross-section (magnification: 30000 times) and FIG. 2 (*b*) is a pattern diagram thereof.

In addition, FIG. 2 illustrates a cross-section of the (Al, Cr)N layer of the cutting tool 2 of the present invention.

FIG. 2 (a) is a TEM photograph (magnification: 30000 times) of the cross-section, and FIG. 2 (b) is a pattern diagram of the cross-section. In FIG. 2 (b), the locations of pores (square marks and rectangular marks), droplets (circular marks and oval marks) and Al-rich droplets (double circle marks and oval double circle marks) are illustrated with the symbols, respectively.

In addition, for the purpose of comparison, Al—Ti bombardment or Ti bombardment was carried out on the surfaces of cutting tool bodies A to E under the conditions described in Table 5 using the arc ion plating apparatus. Next, (Al, Cr)N layers and (Al, Ti)N layers, which had a predetermined layer thickness, were similarly formed through deposition under the conditions described in Table 5. Comparative coated cutting tools 1 to 11 described in Table 6 were manufactured using the above-described steps.

The cross-sections of the (Al, Cr)N layers of comparative coated cutting tools 1 to 11 were also observed using TEM-EDS, and the occupied area ratios of pores to the measured areas (P), the occupied area ratios of droplets to the measured areas (D), and the occupied area ratios of Al-rich droplets to the measured areas (Dal), were measured. In addition, the values of Dal/D were computed based on the above measured values.

Table 7 describes these values respectively.

Figure 3:
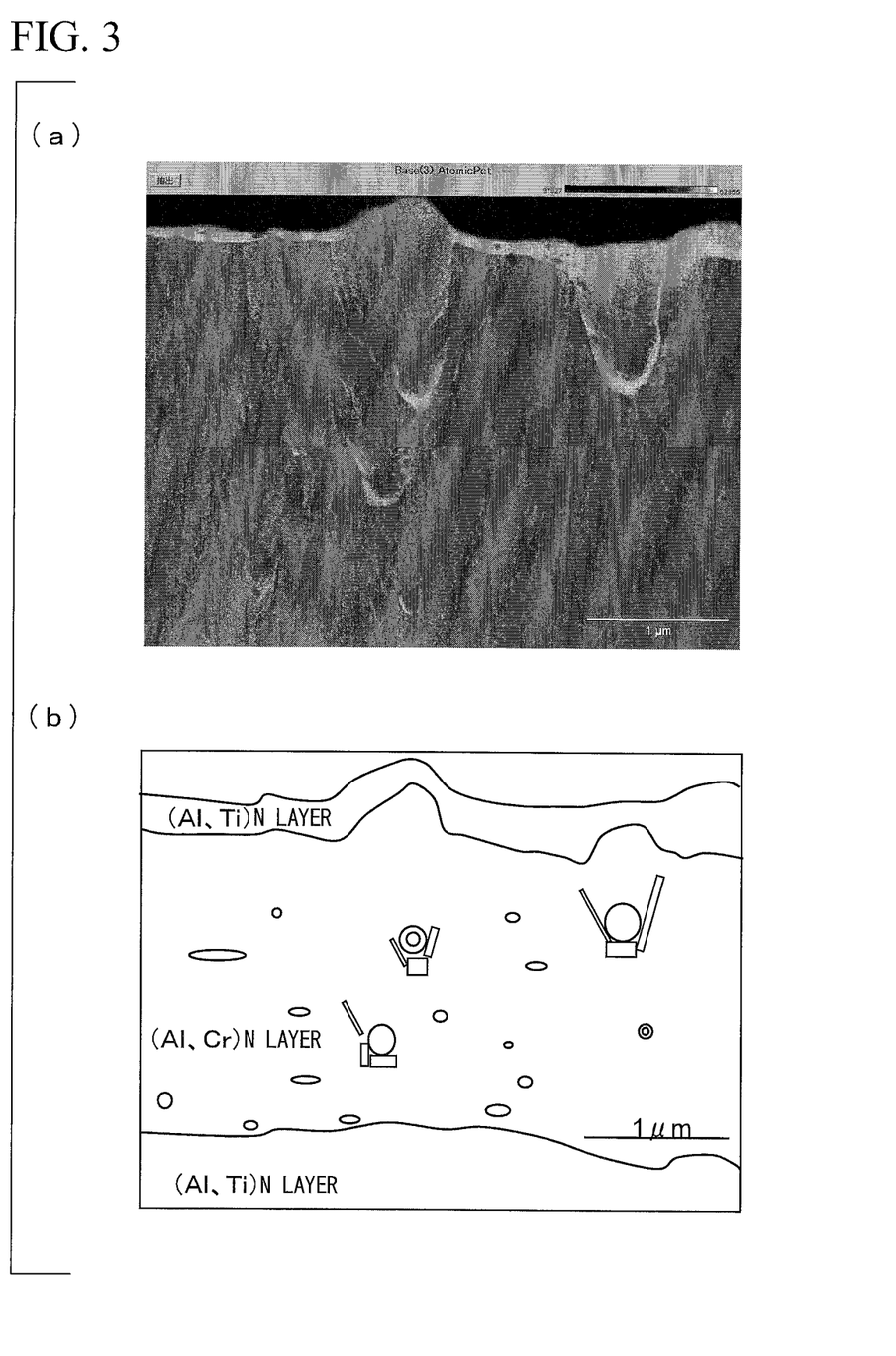
FIG. 3 illustrates the cross-sections of an (Al, Cr)N layer of a comparative coated cutting tool, in which FIG. 3 (*a*) is a TEM photograph of a cross-section (magnification: 30000 times) and FIG. 3 (*b*) is a pattern diagram thereof.

In addition, FIG. 3 illustrates a cross-section of the (Al, Cr)N layer of the comparative coated cutting tool 1.

FIG. 3 (a) is a TEM photograph (magnification: 30000 times) of the cross-section, and FIG. 3 (b) is a pattern diagram of the cross-section. In FIG. 3 (b), the locations of pores (square marks and rectangular marks), droplets (circular marks and oval marks) and Al-rich droplets (double circle marks and oval double circle oval marks) are illustrated with the symbols, respectively.

In addition, the layer thicknesses of the respective constituent layers of coated cutting tools of the present invention 1 to 24 and comparative coated cutting tools 1 to 11 were measured using a scanning electron microscope. In all cases, layers having an average layer thickness that is substantially the same as the target layer thickness shown in Tables 3 and 6 were formed. Meanwhile, the cross-sections of the films were observed using a scanning electron microscope at a magnification of 10,000 times, the layer thicknesses of the respective constituent layers were measured at 5 points, and the averages of those layer thicknesses were considered as the average layer thickness.

In addition, the method for measuring the content ratios (atomic ratio) of the respective constituent layers of the coated cutting tools of the present invention 1 to 24 and comparative coated cutting tools 1 to 11 will be described. Furthermore, content ratio of each layer was calculated as an average value from content ratios at three locations other than the droplet portion in the respective constituent layers using a measurement method of TEM-EDS mapping. The values are described in Tables 3 and 6.

TABLE 1

| Type | | Blend compositions (mass %) | | | | | | | | |
|---|---|---|---|---|---|---|---|---|---|---|
| | | Co | TiC | ZrC | VC | TaC | NbC | $Cr_3C_2$ | TiN | WC |
| Cutting tool body | A | 7 | — | 2 | — | — | 3 | — | 2 | remainder |
| | B | 5.7 | — | — | — | 1.5 | 0.5 | — | — | remainder |
| | C | 5.7 | — | — | — | — | — | 1 | — | remainder |
| | D | 8.5 | — | 0.5 | — | — | — | 0.5 | — | remainder |
| | E | 12.5 | 2 | — | — | — | — | — | 1 | remainder |

TABLE 2

| Type | | Type of cutting tool body | (Al, Ti)N coating conditions | | | | | | | | (Al, Cr)N coating conditions | | | | Magnetic force at the center of target surface (G) |
|---|---|---|---|---|---|---|---|---|---|---|---|---|---|---|---|
| | | | Bombardment conditions | | | | Target content ratio (atomic ratio) | Arc current (A) | Bias voltage (V) | $N_2$ pressure (Pa) | Target content ratio (atomic ratio) | Arc current (A) | Bias voltage (V) | $N_2$ pressure (Pa) | |
| | | | Bombardment type | Arc current (A) | Bias voltage (V) | Number of times | | | | | | | | | |
| Coated cutting tool of the present invention | 1 | A | Al60Ti40 | 100 | −1000 | 8 | Al60Ti40 | 100 | −50 | 4 | Al70Cr30 | 100 | −50 | 9.3 | 55 |
| | 2 | A | Al60Ti40 | 100 | −1000 | 8 | Al60Ti40 | 100 | −50 | 4 | Al70Cr30 | 100 | −50 | 9.3 | 70 |
| | 3 | B | Al60Ti40 | 100 | −1000 | 8 | Al60Ti40 | 100 | −50 | 4 | Al70Cr30 | 100 | −50 | 9.3 | 100 |
| | 4 | C | Ti | 100 | −1000 | 8 | — | — | — | — | Al80Cr20 | 100 | −50 | 9.3 | 55 |
| | 5 | C | Ti | 100 | −1000 | 8 | — | — | — | — | Al80Cr20 | 100 | −50 | 9.3 | 70 |
| | 6 | B | Ti | 100 | −1000 | 8 | — | — | — | — | Al80Cr20 | 100 | −50 | 9.3 | 100 |
| | 7 | D | Al90Ti10 | 100 | −1000 | 12 | Al90Ti10 | 100 | −50 | 4 | Al70Cr30 | 100 | −50 | 9.3 | 70 |
| | 8 | D | Al90Ti10 | 100 | −1000 | 12 | Al90Ti10 | 100 | −50 | 4 | Al70Cr30 | 100 | −50 | 9.3 | 70 |
| | 9 | B | Al60Ti40 | 100 | −1000 | 12 | Al60Ti40 | 100 | −50 | 4 | Al70Cr30 | 100 | −50 | 9.3 | 70 |
| | 10 | E | Al60Ti40 | 100 | −1000 | 12 | Al60Ti40 | 100 | −50 | 4 | Al70Cr30 | 100 | −50 | 0.5 | 70 |
| | 11 | C | Al60Ti40 | 100 | −1000 | 12 | Al60Ti40 | 100 | −50 | 4 | Al70Cr30 | 100 | −50 | 9.3 | 70 |
| | 12 | C | Al60Ti40 | 100 | −1000 | 12 | Al60Ti40 | 100 | −50 | 4 | Al70Cr30 | 100 | −50 | 9.3 | 70 |
| | 13 | D | Al60Ti40 | 100 | −1000 | 12 | Al60Ti40 | 100 | −50 | 4 | Al70Cr30 | 100 | −50 | 9.3 | 70 |
| | 14 | D | Al60Ti40 | 100 | −1000 | 12 | Al60Ti40 | 100 | −50 | 4 | Al70Cr30 | 100 | −50 | 0.5 | 70 |
| | 15 | A | Al60Ti40 | 100 | −1000 | 12 | Al60Ti40 | 100 | −50 | 4 | Al70Cr30 | 100 | −50 | 9.3 | 70 |
| | 16 | A | Al60Ti40 | 100 | −1000 | 12 | Al60Ti40 | 100 | −50 | 4 | Al70Cr30 | 100 | −50 | 9.3 | 70 |
| | 17 | B | Al60Ti40 | 100 | −1000 | 12 | Al60Ti40 | 100 | −50 | 4 | Al70Cr30 | 100 | −50 | 9.3 | 70 |
| | 18 | B | Al60Ti40 | 100 | −1000 | 12 | Al60Ti40 | 100 | −50 | 4 | Al70Cr30 | 100 | −50 | 9.3 | 70 |
| | 19 | E | Al50Ti50 | 100 | −1000 | 12 | Al50Ti50 | 100 | −50 | 4 | Al70Cr30 | 100 | −50 | 9.3 | 70 |
| | 20 | E | Al40Ti60 | 100 | −1000 | 12 | Al40Ti60 | 100 | −50 | 4 | Al70Cr30 | 100 | −50 | 9.3 | 70 |
| | 21 | E | Al70Ti30 | 100 | −1000 | 12 | Al70Ti30 | 100 | −50 | 4 | Al70Cr30 | 100 | −50 | 9.3 | 70 |
| | 22 | A | Al40Ti60 | 100 | −1000 | 12 | Al40Ti60 | 100 | −50 | 4 | Al50Cr50 | 100 | −50 | 9.3 | 70 |
| | 23 | A | Al40Ti60 | 100 | −1000 | 12 | Al40Ti60 | 100 | −50 | 4 | Al60Cr40 | 100 | −50 | 9.3 | 70 |
| | 24 | B | Al40Ti60 | 100 | −1000 | 12 | Al40Ti60 | 100 | −50 | 4 | Al50Cr50 | 100 | −50 | 9.3 | 70 |

TABLE 3

| Type | | Type of cutting tool body | (Al, Ti)N [first layer] | | | (Al, Cr)N [second layer] | | | (Al, Ti)N [third layer] | | |
|---|---|---|---|---|---|---|---|---|---|---|---|
| | | | content ratio (atomic ratio) | | Layer thickness | content ratio (atomic ratio) | | Layer thickness | content ratio (atomic ratio) | | Layer thickness |
| | | | Al | Ti | (μm) | Al | Cr | (μm) | Al | Ti | (μm) |
| Coated cutting tool of the present invention | 1 | A | 59 | 41 | 0.8 | 71 | 29 | 5 | 59 | 41 | 0.3 |
| | 2 | A | 58 | 42 | 0.8 | 72 | 28 | 5 | 60 | 40 | 0.3 |
| | 3 | B | 61 | 39 | 0.8 | 69 | 31 | 5 | 61 | 39 | 0.3 |
| | 4 | C | — | — | — | 81 | 19 | 2.1 | — | — | — |
| | 5 | C | — | — | — | 79 | 21 | 2.1 | — | — | — |
| | 6 | B | — | — | — | 80 | 20 | 2.1 | — | — | — |
| | 7 | D | 90 | 10 | 0.8 | 71 | 29 | 2.1 | 89 | 11 | 0.3 |
| | 8 | D | 88 | 12 | 0.3 | 68 | 32 | 2.1 | 91 | 9 | 0.1 |
| | 9 | B | 60 | 40 | 5 | 70 | 30 | 10 | 59 | 41 | 1 |
| | 10 | E | 62 | 38 | 0.8 | 72 | 28 | 5 | 58 | 42 | 0.3 |
| | 11 | C | 60 | 40 | 0.6 | 69 | 31 | 0.7 | 60 | 40 | 0.3 |
| | 12 | C | 61 | 39 | 5 | 71 | 29 | 0.7 | 61 | 39 | 1 |
| | 13 | D | 61 | 39 | 0.5 | 70 | 30 | 4.8 | 61 | 39 | 1 |
| | 14 | D | 61 | 39 | 5 | 68 | 32 | 4.8 | 61 | 39 | 0.3 |
| | 15 | A | 62 | 38 | 0.3 | 70 | 30 | 0.7 | 58 | 42 | 0.1 |
| | 16 | A | 59 | 41 | 0.3 | 72 | 28 | 0.7 | 59 | 41 | 2 |
| | 17 | B | 62 | 38 | 5.5 | 69 | 31 | 4.8 | 57 | 43 | 0.1 |
| | 18 | B | 59 | 41 | 5.5 | 68 | 32 | 4.8 | 59 | 41 | 1.5 |
| | 19 | E | 50 | 50 | 0.8 | 68 | 32 | 5 | 52 | 48 | 0.3 |
| | 20 | E | 40 | 60 | 0.8 | 71 | 29 | 5 | 41 | 59 | 0.3 |
| | 21 | E | 71 | 29 | 0.8 | 72 | 28 | 5 | 71 | 29 | 0.3 |
| | 22 | A | 40 | 60 | 0.8 | 52 | 48 | 5 | 41 | 59 | 0.3 |
| | 23 | A | 38 | 62 | 0.8 | 60 | 40 | 5 | 40 | 60 | 0.3 |
| | 24 | B | 37 | 63 | 0.8 | 48 | 52 | 5 | 38 | 62 | 0.3 |

TABLE 4

| Type | | P (area %) | D (area %) | Dal (area %) | Dal/D |
|---|---|---|---|---|---|
| Coated cutting tool of the present invention | 1 | 0.94 | 2.22 | 0.52 | 0.23 |
| | 2 | 0.81 | 2.71 | 0.87 | 0.32 |
| | 3 | 0.55 | 3.69 | 1.79 | 0.49 |
| | 4 | 0.87 | 2.36 | 1.71 | 0.72 |
| | 5 | 0.72 | 3.24 | 1.96 | 0.60 |
| | 6 | 0.53 | 3.91 | 3.12 | 0.80 |
| | 7 | 0.79 | 2.64 | 0.79 | 0.30 |
| | 8 | 0.75 | 2.82 | 0.84 | 0.30 |
| | 9 | 0.72 | 2.76 | 0.91 | 0.33 |
| | 10 | 0.84 | 2.69 | 0.88 | 0.33 |
| | 11 | 0.75 | 2.63 | 0.92 | 0.35 |
| | 12 | 0.76 | 2.72 | 0.84 | 0.31 |
| | 13 | 0.72 | 2.84 | 0.82 | 0.29 |
| | 14 | 0.77 | 2.69 | 0.78 | 0.29 |
| | 15 | 0.71 | 2.79 | 0.81 | 0.29 |
| | 16 | 0.73 | 2.68 | 0.80 | 0.30 |
| | 17 | 0.75 | 2.82 | 0.92 | 0.33 |
| | 18 | 0.74 | 2.64 | 0.85 | 0.32 |
| | 19 | 0.82 | 2.59 | 0.80 | 0.31 |
| | 20 | 0.79 | 2.53 | 0.83 | 0.33 |
| | 21 | 0.77 | 2.63 | 0.78 | 0.30 |
| | 22 | 0.74 | 2.70 | 0.62 | 0.23 |
| | 23 | 0.72 | 2.65 | 0.73 | 0.28 |
| | 24 | 0.68 | 2.81 | 0.59 | 0.21 |

TABLE 5

| Type | | Type of cutting tool body | Bombardment conditions | | | | (Al, Ti)N coating conditions | | | | (Al, Cr)N coating conditions | | | | Magnetic force at the center of target surface (G) |
|---|---|---|---|---|---|---|---|---|---|---|---|---|---|---|---|
| | | | Bombardment type | Arc current (A) | Bias voltage (V) | Number of times | Target content ratio (atomic ratio) | Arc current (A) | Bias voltage (V) | N$_2$ pressure (Pa) | Target content ratio (atomic ratio) | Arc current (A) | Bias voltage (V) | N$_2$ pressure (Pa) | |
| Comparative coated cutting tool | 1 | A | Al60Ti40 | 100 | −1000 | 8 | Al60Ti40 | 100 | −50 | 4 | Al70Cr30 | 100 | −50 | 9.3 | 25 |
| | 2 | A | Al60Ti40 | 100 | −1000 | 8 | Al60Ti40 | 100 | −50 | 4 | Al70Cr30 | 100 | −50 | 9.3 | 50 |
| | 3 | B | Al60Ti40 | 100 | −1000 | 8 | Al60Ti40 | 100 | −50 | 4 | Al70Cr30 | 100 | −50 | 9.3 | 120 |
| | 4 | C | Ti | 100 | −1000 | 8 | — | — | — | — | Al70Cr30 | 100 | −50 | 9.3 | 25 |
| | 5 | C | Al60Ti40 | 100 | −1000 | 8 | — | — | — | — | Al70Cr30 | 100 | −50 | 9.3 | 50 |
| | 6 | B | Ti | 100 | −1000 | 8 | — | — | — | — | Al70Cr30 | 100 | −50 | 9.3 | 120 |
| | 7 | D | Al50Ti50 | 100 | −1000 | 12 | Al50Ti50 | 100 | −50 | 4 | Al70Cr30 | 100 | −50 | 9.3 | 70 |
| | 8 | D | Al50Ti50 | 100 | −1000 | 12 | Al50Ti50 | 100 | −50 | 4 | Al70Cr30 | 100 | −50 | 9.3 | 70 |
| | 9 | B | Al50Ti50 | 100 | −1000 | 12 | Al50Ti50 | 100 | −50 | 4 | Al70Cr30 | 100 | −50 | 0.3 | 70 |
| | 10 | E | Al50Ti50 | 100 | −1000 | 12 | — | — | — | — | Al70Cr30 | 100 | −50 | 9.3 | 70 |
| | 11 | E | Al50Ti50 | 100 | −1000 | 12 | — | — | — | — | Al70Cr30 | 100 | −50 | 9.3 | 70 |

TABLE 6

| | Type of cutting tool | Type body | (Al, Ti)N [first layer] content ratio (atomic ratio) Al | (Al, Ti)N [first layer] content ratio (atomic ratio) Ti | (Al, Ti)N [first layer] Layer thickness (mm) | (Al, Cr)N [second layer] content ratio (atomic ratio) Al | (Al, Cr)N [second layer] content ratio (atomic ratio) Cr | (Al, Cr)N [second layer] Layer thickness (mm) | (Al, Ti)N [third layer] content ratio (atomic ratio) Al | (Al, Ti)N [third layer] content ratio (atomic ratio) Ti | (Al, Ti)N [third layer] Layer thickness (μm) |
|---|---|---|---|---|---|---|---|---|---|---|---|
| Comparative | 1 | A | 61 | 39 | 0.8 | 68 | 32 | 2.1 | 61 | 39 | 0.3 |
| coated | 2 | A | 58 | 42 | 0.8 | 70 | 30 | 2.1 | 59 | 41 | 0.3 |
| cutting | 3 | B | 60 | 40 | 0.8 | 71 | 29 | 2.1 | 61 | 39 | 0.3 |
| tool | 4 | C | — | — | — | 69 | 31 | 3 | — | — | — |
| | 5 | C | — | — | — | 72 | 28 | 3 | — | — | — |
| | 6 | B | — | — | — | 71 | 29 | 3 | — | — | — |
| | 7 | D | 51 | 49 | 0.8 | 68 | 32 | *20 | 49 | 51 | 0.3 |
| | 8 | D | 52 | 48 | 0.8 | 69 | 31 | *0.1 | 48 | 52 | 0.3 |
| | 9 | B | 49 | 51 | 0.8 | 72 | 28 | 5 | 51 | 49 | 0.5 |
| | 10 | E | — | — | — | 70 | 30 | *20 | — | — | — |
| | 11 | E | — | — | — | 71 | 29 | *0.1 | — | — | — |

*mark indicates that the value is outside the range of the present invention.

TABLE 7

| Type | | P (area %) | D (area %) | Dal (area %) | Dal/D |
|---|---|---|---|---|---|
| Comparative | 1 | *2.73 | 1.78 | 0.15 | *0.08 |
| coated | 2 | *1.35 | 1.86 | 0.23 | *0.12 |
| tool | 3 | *0.32 | *5.23 | 4.61 | 0.88 |
| | 4 | *2.70 | 1.68 | 0.16 | *0.10 |
| | 5 | *1.31 | 1.91 | 0.2 | *0.10 |
| | 6 | *0.28 | *5.11 | 4.55 | 0.89 |
| | 7 | 0.82 | 2.71 | 0.80 | 0.30 |
| | 8 | 0.86 | 2.62 | 0.79 | 0.30 |
| | 9 | *1.52 | *4.72 | 1.45 | 0.31 |
| | 10 | 0.81 | 2.73 | 0.82 | 0.30 |
| | 11 | 0.85 | 2.69 | 0.77 | 0.29 |

*mark indicates that the value is outside the range of the present invention.

Next, dry high-feed milling cutting tests were carried out on the coated cutting tools of the present invention 1 to 24 and comparative coated cutting tools 1 to 11 under the conditions described below, and the widths of flank wear of the cutting edges were measured.

Work: a block material of JIS-SKD61 (HRC52),
Rotation speed: 17000/min.,
Cutting speed: 300 m/min.,
Cutting depth: ae 0.3 mm, ap 2.0 mm,
Feed per tooth: 0.05 mm/tooth,
Cutting oil: air,
Cutting time: 5 minutes.
Table 8 describes the results of the cutting tests.

TABLE 8

| Type | | Width of flank wear (mm) | Type | | Cutting time (minutes) |
|---|---|---|---|---|---|
| Coated | 1 | 0.09 | comparative | 1 | 1.3 |
| cutting | 2 | 0.07 | coated | 2 | 2.1 |
| tool of | 3 | 0.05 | cutting | 3 | 2.2 |
| the present | 4 | 0.22 | tool | 4 | 1 |
| invention | 5 | 0.2 | | 5 | 1.8 |
| | 6 | 0.21 | | 6 | 1.9 |
| | 7 | 0.13 | | 7 | 0.9 |
| | 8 | 0.18 | | 8 | 2.1 |
| | 9 | 0.1 | | 9 | 0.8 |
| | 10 | 0.12 | | 10 | 0.5 |
| | 11 | 0.1 | | 11 | 1.7 |
| | 12 | 0.08 | | | |
| | 13 | 0.09 | | | |
| | 14 | 0.12 | | | |
| | 15 | 0.16 | | | |
| | 16 | 0.15 | | | |
| | 17 | 0.14 | | | |
| | 18 | 0.15 | | | |
| | 19 | 0.08 | | | |
| | 20 | 0.09 | | | |
| | 21 | 0.08 | | | |
| | 22 | 0.11 | | | |
| | 23 | 0.18 | | | |
| | 24 | 0.21 | | | |

The cutting test results in the column for comparative coated cutting tool indicate the cutting time (minutes) taken until the service life ends due to chipping, fracturing and the like.

The results shown in Tables 4, 7 and 8 indicate the following. In the coated cutting tool of the embodiment of the present invention, the layer thickness of the (Al, Cr)N layer of the hard coating layer is 0.5 μm to 10 μm, the occupied area ratio P of pores is 0.5 area % to 1 area %, the occupied area ratio D of all droplets is 2 area % to 4 area %, the occupied area ratio Dal of Al-rich droplets is 0.4 area % to 4 area %, and Dal/D≥0.2. By having the above characteristics concurrently, the coated cutting tool of the embodiment of the present invention exhibits excellent fracture resistance in high-speed cutting and exhibits excellent wear resistance over long-term use.

In contrast to the above, in comparative coated cutting tools 1 to 11, any of the layer thicknesses of the (Al, Cr)N layers of the hard coating layers, the occupied area ratios P of pores, the occupied area ratios D of all droplets, the occupied area ratios Dal of Al-rich droplets and the Dal/D values was outside the ranges specified in the present invention. Since comparative coated cutting tools 1 to 11 lacked any one of the above characteristics, chipping, fracturing and the like are caused during high-speed cutting, and, consequently, the service lives end in a relatively short period of time.

INDUSTRIAL APPLICABILITY

The coated cutting tool of the present invention enables the exhibition of excellent fracture resistance and wear resistance in high-speed cutting of a work, such as carbon steel or alloy steel, and the extension of the service life. In addition, a long service life can be expected even in a case in which the coated cutting tool is used in cutting of other works or in cutting under other conditions.

BRIEF DESCRIPTION OF THE REFERENCE SYMBOLS

1: ROTARY TABLE
2: ROTARY TABLE DRIVING SHAFT
3: BIAS POWER SUPPLY
4: CHAMBER
5: ROTARY SHAFT
6: CUTTING TOOL BODY
7: HEATER
8: CATHODE ELECTRODE (Ti—Al EVAPORATION SOURCE)
9: CATHODE ELECTRODE (Al—Cr EVAPORATION SOURCE)
10, 11: ELECTROMAGNETIC COIL
12, 13: ANODE ELECTRODE
14, 15: ARC POWER SUPPLY
16: REACTION GAS INFLOW PATH
17: EXHAUST GAS OUTFLOW PATH

The invention claimed is:

1. A surface-coated cutting tool comprising:
a cutting tool body made of tungsten carbide-based cemented carbide; and
a hard coating layer including an Al and Cr composite nitride layer, which is formed on the cutting tool body to coat the cutting tool body and has a layer thickness of 0.5 μm to 10 μm,
wherein pores and droplets are dispersed and distributed in the Al and Cr composite nitride layer,
a percentage of an area occupied by the pores in a cross-sectional area of the Al and Cr composite nitride layer is 0.5 to 1% of the area of the layer and a percentage of an area occupied by the droplets in the cross-sectional area is 2 to 4% of the area of the layer and,
out of the droplets, Al-rich droplets having an Al content higher than an average Al content contained in the Al and Cr composite nitride layer occupy 20% or more of a total droplet area in the cross-sectional area.

2. The surface-coated cutting tool according to claim 1, wherein the hard coating layer includes a first layer made of an Al and Ti composite nitride layer formed to coat the cutting tool body, a second layer made of an Al and Cr composite nitride layer formed to coat on the first layer, and a third layer made of an Al and Ti composite nitride layer formed to coat on the second layer, and
a content percentage of Ti to a total amount of Ti and Al in the first layer and the third layer made of the Al and Ti composite nitride layer is 20 atomic% to 60 atomic %.

3. The surface-coated cutting tool according to claim 2, wherein layer thicknesses of the first layer and the third layer made of the Al and Ti composite nitride layer are 0.5 μm to 5μm and 0.2 μm to 1 μm respectively.

4. The surface-coated cutting tool according to claim 3, wherein a content percentage of Cr to a total amount of Cr and Al in the Al and Cr composite nitride layer is 20 atomic% to 50 atomic %.

5. The surface-coated cutting tool according to claim 1, wherein a content percentage of Cr to a total amount of Cr and Al in the Al and Cr composite nitride layer is 20 atomic % to 50 atomic %.

6. The surface-coated cutting tool according to claim 2, wherein a content percentage of Cr to a total amount of Cr and Al in the Al and Cr composite nitride layer is 20 atomic % to 50 atomic %.

7. A method for manufacturing a surface-coated cutting tool in which a hard coating layer including a composite nitride layer is formed on a cutting tool body using an arc ion plating method, comprising:
a hard coating layer-forming step of forming a hard coating layer through deposition on the cutting tool body using an arc ion plating apparatus,
wherein the hard coating layer-forming step comprises:
a cutting tool body inserting step in which the cutting tool body is placed on a rotatable rotary table provided in the arc ion plating apparatus;
a rotating step in which the rotary table having the cutting tool body placed thereon is rotated;
a target-evaporating step in which a target made of an Al—Cr alloy placed on one side of both sides of the rotary table is evaporated by arc discharge; and
a magnetic field generation step in which the magnetic flux density of 55 G to 100 G is generated at a center of a surface of the target made of the Al—Cr alloy, and
the composite nitride layer is an Al and Cr composite nitride layer,
pores and droplets are dispersed and distributed in the Al and Cr composite nitride layer,
a percentage of an area occupied by the pores in a cross-sectional area of the Al and Cr composite nitride layer is 0.5 to 1% of the area of the layer and a percentage of an area occupied by the droplets in a the cross-sectional area is 2 to 4% of the area of the layer and,
out of the droplets, Al-rich droplets having an Al content higher than an average Al content of the Al and Cr composite nitride layer occupy 20% or more of a total droplet area in the cross-sectional area.

* * * * *